(12) United States Patent
Seo

(10) Patent No.: US 10,074,408 B2
(45) Date of Patent: Sep. 11, 2018

(54) BIT LINE SENSE AMPLIFIER

(71) Applicant: SAMSUNG ELECTRONICS CO., LTD., Suwon-si, Gyeonggi-Do (KR)

(72) Inventor: Young-hun Seo, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/674,022

(22) Filed: Aug. 10, 2017

(65) Prior Publication Data

US 2018/0061461 A1 Mar. 1, 2018

(30) Foreign Application Priority Data

Aug. 24, 2016 (KR) .................. 10-2016-0107780

(51) Int. Cl.
*G11C 7/12* (2006.01)
*G11C 7/08* (2006.01)
*G11C 7/18* (2006.01)
*G11C 7/10* (2006.01)

(52) U.S. Cl.
CPC ............. *G11C 7/08* (2013.01); *G11C 7/12* (2013.01); *G11C 7/18* (2013.01); *G11C 7/10* (2013.01); *G11C 7/1051* (2013.01)

(58) Field of Classification Search
CPC .... G11C 7/08; G11C 7/12; G11C 7/18; G11C 7/10; G11C 7/1051
USPC ...... 365/208, 189.15, 190, 206, 207, 230.03
See application file for complete search history.

(56) References Cited

U.S. PATENT DOCUMENTS

| | | | |
|---|---|---|---|
| 4,858,195 A | 8/1989 | Soneda | |
| 5,300,839 A | 4/1994 | Kawahara et al. | |
| 6,028,803 A | 2/2000 | Kopley et al. | |
| 6,181,621 B1 | 1/2001 | Lovett | |
| 6,396,733 B1* | 5/2002 | Lu | G11C 11/15 365/158 |
| 6,466,501 B2 | 10/2002 | Kim et al. | |
| 7,123,531 B2 | 10/2006 | Rho | |
| 7,221,605 B2 | 5/2007 | Forbes | |
| 7,498,850 B2 | 3/2009 | Hendrickson | |
| 8,125,840 B2 | 2/2012 | Barth, Jr. et al. | |
| 8,233,343 B2 | 7/2012 | Moon | |
| 8,295,112 B2 | 10/2012 | Katoch et al. | |
| 9,202,531 B2 | 12/2015 | Seo | |
| 2006/0034133 A1* | 2/2006 | Sekiguchi | G11C 5/063 365/190 |
| 2014/0198596 A1* | 7/2014 | Seo | G11C 11/4091 365/208 |

(Continued)

*Primary Examiner* — Tan T. Nguyen
(74) *Attorney, Agent, or Firm* — F. Chau & Associates, LLC

(57) ABSTRACT

A bit line sense amplifier with an enhanced sensing margin is provided. The bit line sense amplifier includes a sensing amplification circuit connected to a bit line and a complementary bit line and configured to sense a voltage change of the bit line and adjust voltages of a sensing bit line. Also provided is a complementary sensing bit line based on the sensed voltage change, wherein the sensing amplification circuit includes a first transistor connected between the complementary sensing bit line and a first high-voltage node and controlled by the voltage change of the bit line. A second transistor is connected between the sensing bit line and a second high-voltage node and controlled by a voltage change of the complementary bit line.

19 Claims, 15 Drawing Sheets

(56) References Cited

U.S. PATENT DOCUMENTS

2016/0012868 A1   1/2016   Moon et al.

\* cited by examiner

BIT LINE SENSE AMPLIFIER

CROSS-REFERENCE TO RELATED APPLICATION

This application claims the benefit of priority from Korean Patent Application No. 10-2016-0107780, filed on Aug. 24, 2016, in the Korean Intellectual Property Office, the disclosure of which is incorporated by reference herein.

TECHNICAL FIELD

The inventive concept relates to a semiconductor memory device, and more particularly, to a bit line sense amplifier for sensing and amplifying a bit line of a semiconductor memory device.

DISCUSSION OF THE RELATED ART

A semiconductor memory device is implemented using semiconductors such as silicon (Si), germanium (Ge), gallium arsenide (GaAs), or indium phosphide (InP). Semiconductor memory devices may be divided into two types, namely volatile memory devices and nonvolatile memory devices.

In a volatile memory device, data stored in the volatile memory device disappears if a power supplied to the volatile memory device is interrupted. A volatile memory device includes a static random access memory (SRAM), a dynamic RAM (DRAM), a synchronous DRAM (SDRAM), and the like.

In a nonvolatile memory device, data stored in the nonvolatile memory device does not disappear even if a power supplied to the nonvolatile memory is interrupted. The nonvolatile memory device may include, for example, read only memory (ROM), programmable ROM (PROM), electrically programmable ROM (EPROM), electrically erasable and programmable ROM (EEPROM), NAND flash memory, NOR flash memory, phase-change RAM (PRAM), magnetic RAM (MRAM), resistive RAM (RRAM), ferroelectric RAM (FRAM), and the like.

In DRAM, a memory cell array may include memory cells connected to a bit line BL and a complementary bit line BLB. When a read operation (or a refresh operation) is performed, the bit line sense amplifier may sense and amplify a voltage difference between the bit line BL and the complementary bit line BLB.

SUMMARY

The inventive concept provides a bit line sense amplifier that is capable of increasing an effective sensing margin.

According to an embodiment of the inventive concept, there is provided a bit line sense amplifier including: a sensing amplification circuit connected to a bit line and a complementary bit line and configured to sense a voltage change of the bit line and adjust voltages of a sensing bit line and a complementary sensing bit line based on the sensed voltage change; an isolation switching circuit including a first isolation switch connected to the bit line and the sensing bit line and controlled by an isolation switch control signal, and a second isolation switch connected between the complementary bit line and the complementary sensing bit line and controlled by the isolation signal; and an offset cancellation circuit including a first offset cancellation switch connected between the bit line and the complementary sensing bit line and controlled by an offset cancellation control signal, and a second offset cancellation switch connected between the complementary bit line and the sensing bit line and controlled by the offset cancellation signal, wherein the sensing amplification unit includes: a first transistor connected between the complementary sensing bit line and a first high-voltage node and controlled by the voltage change of the bit line; and a second transistor connected between the sensing bit line and a second high-voltage node and controlled by a voltage change of the complementary bit line.

According to an embodiment of the inventive concept, there is provided a bit line sense amplifier including: a sensing amplification unit connected to a bit line and a complementary bit line and configured to sense a voltage change of the bit line and adjust voltages of a sensing bit line and a complementary sensing bit line based on the sensed voltage change; an isolation switching unit including a first isolation switch connected to the bit line and the complementary bit line and controlled by an isolation signal, and a second isolation switch connected between the complementary bit line and the complementary sensing bit line and controlled by the isolation signal; and an offset cancellation unit including a first offset cancellation switch connected between the bit line and the complementary sensing bit line and controlled by an offset cancellation signal, and a second offset cancellation switch connected between the complementary bit line and the sensing bit line and controlled by the offset cancellation signal, wherein the sensing amplification unit includes: a first transistor connected between the complementary sensing bit line and a first high-voltage node and controlled by a voltage change of the bit line, and a second transistor connected between the sensing bit line and the first high-voltage node and controlled by a voltage change of the complementary bit line; a third transistor connected between the complementary sensing bit line and a first low-voltage node and controlled by a voltage change of the sensing bit line; and a fourth transistor connected between the sensing bit line and a second low-voltage node and controlled by a voltage change of the complementary sensing bit line.

According to an embodiment of the inventive concept, a memory device includes a plurality of memory cell arrays; a plurality of bit line sense amplifier sub-circuits alternately arranged with the plurality of memory cell arrays, each one of the plurality of bit line sense amplifier sub-circuits comprising a plurality of bit line sense amplifiers configured to sense a voltage change of a respective bit line and control voltages of a sensing bit line (SBL) and a complementary sensing bit line (SBLB); a plurality of bit line pairs BL and BLB, in which each BLB line comprises a complementary bit line corresponding to a respective bit line BL, wherein the plurality of bit line pairs BL and BLB are connected to the plurality of memory cell arrays, respectively, and connected to the plurality of bit line sense amplifiers. Each of the plurality of bit line sense amplifiers is configured to perform an offset cancellation operation and a pre-sensing operation for at least one of the plurality of bit line pairs BL and BLB.

During the offset cancellation operation, the bit line BL may have a higher voltage than the complementary bit line BLB by an offset voltage.

A power supply voltage may be separately applied to the sensing bit line SBL and the complementary sensing bit line SBLB.

In addition, each of the plurality of the bit line sense amplifiers may be configured to sense a voltage change of the bit line BL in at least one of the plurality of bit line pairs BL and BLB, and to adjust voltages of the sensing bit line SBL and the complementary sensing bit line SBLB arranged to sense based on the sensed voltage change; and the memory device may include an isolation switching circuit including a first isolation switch connected to the bit line and the sensing bit line and controlled by an isolation control signal.

BRIEF DESCRIPTION OF THE DRAWINGS

Example embodiments of the inventive concept will be more clearly understood by a person of ordinary skill in the art from the following detailed description taken in conjunction with the accompanying drawings in which.

DETAILED DESCRIPTION

Figure 1:
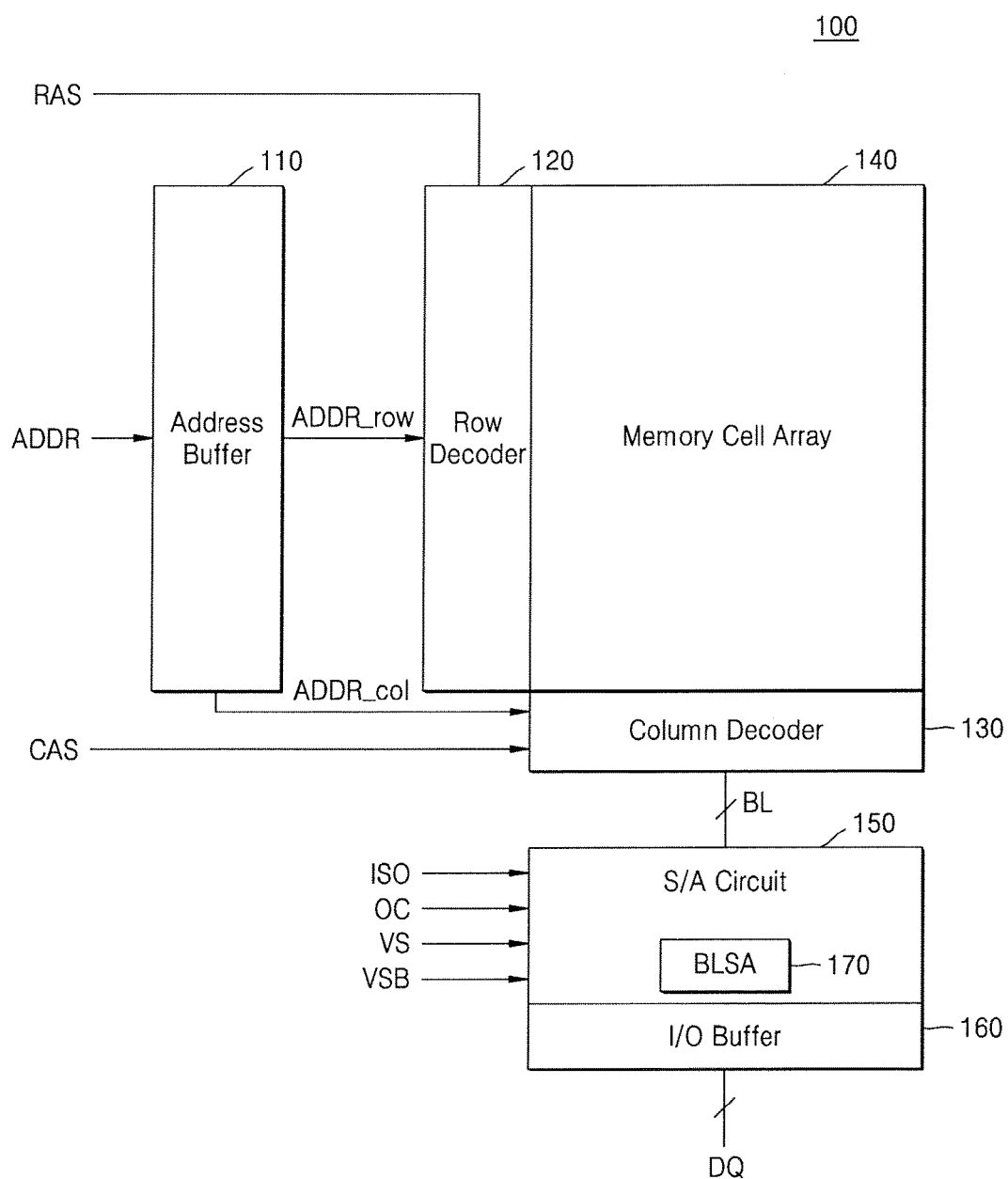
FIG. 1 is a block diagram of a memory device according to an example embodiment of the inventive concept.

FIG. 1 is a block diagram of a memory device 100 according to an example embodiment of the inventive concept.

Referring to FIG. 1, the memory device 100 shown may be a storage device based on a semiconductor device. For example, the memory device 100 may be provided as a random access memory (RAM) device, such as a dynamic random access memory (DRAM), synchronous DRAM (SDRAM), a static RAM (SRAM), a double-data rate SDRAM (DDR SDRAM), DDR2 SDRAM, DDR3 SDRAM, a phase-change RAM (PRAM), a magnetic RAM (MRAM), resistive RAM (RRAM), and the like. The memory device 100 may receive data or output data through data lines DQ in response to receiving an address ADDR and control signals RAS and CAS received from an external device (e.g., a memory controller). The memory device 100 may include, for example, an address buffer 110, a row decoder 120, a column decoder 130, a memory cell array 140, a bit line sense amplifier circuit 150, and an input/output buffer 160.

The address buffer 110 may receive an address ADDR from an external device (e.g., a memory controller). The address ADDR may include a row address ADDR_row indicating a row of the memory cell array 140 and a column address ADDR_col indicating a column of the memory cell array 140. The address buffer 110 may transmit the row address ADDR_row to the row decoder 120. The address buffer 110 may transmit the column address ADDR_col to the column decoder 130.

The row decoder 120 may select any one of a plurality of word lines connected to the memory cell array 140. For example, the row decoder 120 may receive the row address ADDR_row from the address buffer 110. The row decoder 120 may select any word line corresponding to the received row address ADDR_row among the plurality of word lines connected to the memory cell array. The row decoder 120 may activate the selected word line in response to receiving a control signal RAS.

The column decoder 130 may select any one of a plurality of bit lines BL connected to the memory cell array 140. For example, the column decoder 130 may receive the column address ADDR_col from the address buffer 110. The column decoder 130 may select any one bit line corresponding to the received column address ADDR_col among the plurality of bit lines BL. The column decoder 130 may activate the selected bit line in response to a control signal CAS.

The memory cell array 140 may include a plurality of memory cells. Each of the plurality of memory cells may be located at a point where a plurality of word lines and a plurality of bit lines intersect. A plurality of memory cells are connected to a plurality of word lines and a plurality of bit lines. Each of the plurality of memory cells may be provided in a matrix form. A plurality of word lines may be connected to rows of memory cells of the memory cell array 140. A plurality of bit lines may be connected to columns of memory cells of the memory cell array 140.

The bit line sense amplifier circuit 150 may be connected to the plurality of bit lines connected to the memory cell array 140. The bit line sense amplifier circuit 150 senses a voltage change in an activated bit line among the plurality of bit lines, and amplifies (e.g., via a bit line sense amplifier 170) and outputs the changed voltage. The input/output buffer 160 may output data to an external device via the data lines DQ based on the voltage amplified in the bit line sense amplifier circuit 150.

The bit line sense amplifier circuit 150 may include a bit line sense amplifier (BLSA) 170. According to an example embodiment of the inventive concept, the bit line sense amplifier 170 may receive an isolation signal ISO, an offset cancellation signal OC, a power voltage control signal VS, and a complementary power voltage control signal VSB from a control logic of the memory device 100 or an external device (e.g., a memory controller) of the memory device 100.

According to another example embodiment of the inventive concept, the bit line sense amplifier 170 may receive the isolation signal ISO, the offset cancellation signal OC, and the power supply voltage control signal VS from a control logic or an external device (e.g., a memory controller), and may generate the complementary power supply voltage control signal VSB based on the received power supply voltage control signal VS. The bit line sense amplifier 170 may perform an offset cancellation operation and a pre-sensing operation according to the received isolation signal ISO and the offset cancellation signal OC. For example, an offset may indicate a difference in characteristics (e.g., a threshold voltage) between devices included in the bit line sense amplifier circuit 150.

The isolation signal ISO and the offset cancellation signal OC may control the operation of a plurality of switches included in the bit line sense amplifier 170. For example, when switches operating under the control of the isolation signal ISO are turned off and switches operating under the control of the offset cancellation signal OC are turned on, the bit line sense amplifier 170 may perform an offset cancellation operation. When the switches operating under the control of the isolation signal ISO and the switches operating under the control of the offset cancellation signal OC are both turned off, the bit line sense amplifier 170 may perform a pre-sensing operation.

In an example embodiment of the inventive concept, the bit line sense amplifier 170 may receive the power supply voltage control signal VS and the complementary power supply voltage control signal VSB. The source voltage control signal VS and the complementary source voltage control signal VSB may control a voltage to which a sensing bit line or a complementary sensing bit line is applied during a bit line sensing process. Furthermore, in the bit line sense amplifier 170 according to an example embodiment of the inventive concept, voltages applied to a sensing bit line and a complementary sensing bit line may be respectively controlled based on the power supply voltage control signal VS and the complementary power supply voltage control signal VSB. For example, the control signal voltages VS and VSB may be separately supplied. With such a configuration, the bit line sense amplifier 170 may easily control bit line sensing and the bit line sensing may be performed more efficiently. A configuration and operation of the bit line sense amplifier 170 will be described herein below in more detail with reference to the following drawings.

Figure 2:
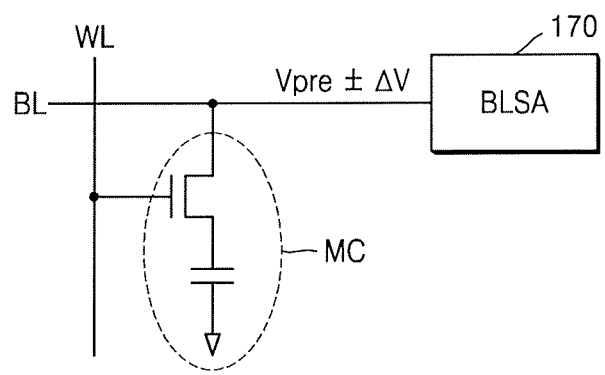
FIG. 2 is a block diagram illustrating a bit line voltage sensing operation of a bit line sense amplifier, according to an example embodiment of the inventive concept.

FIG. 2 is a block diagram illustrating a bit line voltage sensing operation of the bit line sense amplifier 170, according to an example embodiment of the inventive concept. For convenience of description, configurations other than the bit line sense amplifier 170, a bit line BL, a word line WL, and a memory cell MC are omitted.

Referring to FIGS. 1 and 2, the memory device 100 may perform a refresh operation based on a charge amount of a capacitor included in the memory cell MC. For example, the bit line BL connected to the memory cell MC may be precharged to a precharge voltage Vpre. Thereafter, as the word line WL is activated, charge sharing between charges of the bit line BL charged with the precharge voltage Vpre and charges of the capacitor of the memory cell MC may be generated. A voltage of a bit line BL may decrease or increase by a voltage variation amount ΔV due to the charge sharing. The bit line sense amplifier 170 may sense the voltage variation amount ΔV and amplify the voltage. However, when the voltage variation amount ΔV of the bit line BL is lower than a certain level, the bit line sense amplifier 170 may not sense the voltage variation amount ΔV of the bit line BL.

According to an example embodiment of the inventive concept, the bit line sense amplifier 170 performs an offset cancellation operation and a pre-sensing operation in response to the isolation signal ISO and the offset cancellation signal OC so that a bit line (BL) coupling noise and a bit line sense amplifier (S/A) offset noise may be reduced. Accordingly, a voltage variation amount ΔV exceeding a certain level may be secured. In addition, a power supply voltage of a sensing bit line and a complementary sensing bit line are separately applied to perform bit line sensing more efficiently, and a sensing error may be prevented.

Figure 3:
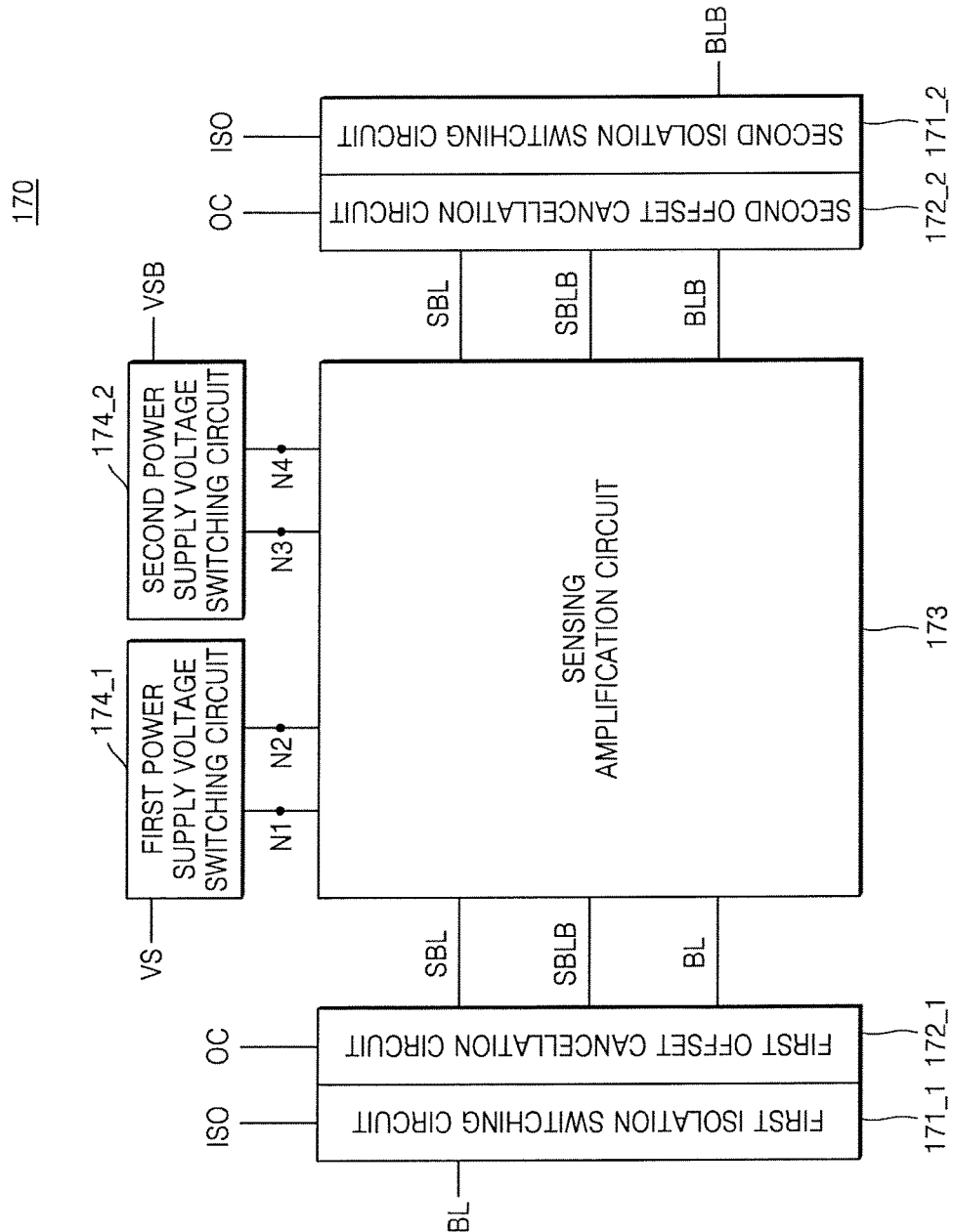
FIG. 3 is a block diagram of a bit line sense amplifier according to an example embodiment of the inventive concept.

FIG. 3 is a block diagram of the bit line sense amplifier 170 according to an example embodiment of the inventive concept.

Referring to the example embodiment shown in FIG. 3, the bit line sense amplifier 170 may include a first isolation switching circuit 171_1, a first offset cancellation circuit 172_1, a sensing amplification circuit 173, a second isolation switching circuit 171_2, a second offset cancellation circuit 172_2, a first power supply voltage switching circuit 174_1, and a second power supply voltage switching circuit 174_2. According to another example embodiment, the bit line sense amplifier 170 may omit the first power supply voltage switching circuit 174_1 and the second power supply voltage switching circuit 174_2 unlike the construction shown in FIG. 3.

The first isolation switching circuit 171_1 may be connected to the bit line BL and a sensing bit line SBL. The first isolation switching circuit 171_1 may connect or disconnect the bit line BL and the sensing bit line SBL in response to receiving the isolation signal ISO. Also, the second isolation switching circuit 1712 may be connected to the complementary bit line BLB and a complementary sensing bit line SBLB. The second isolation switching circuit 171_2 may connect or disconnect the complementary bit line BLB and the complementary sensing bit line SBLB in response to receiving the isolation signal ISO.

The first offset cancellation circuit 172_1 may be connected to the bit line BL and the complementary sensing bit line SBLB. The first offset cancellation circuit 172_1 may connect, or disconnect, the bit line BL and the complementary sensing bit line SBLB in response to receiving the offset cancellation signal OC. In addition, the second offset cancellation circuit 172_2 may be connected to the complementary bit line BLB and the sensing bit line SBL. The second offset cancellation circuit 172_2 may connect, or disconnect, the complementary bit line BLB and the sensing bit line SBL in response to the offset cancellation signal OC.

As used herein, the terms "high-voltage node" and "low-voltage node" may be relative in terms of their highest voltage versus ground, e.g., a high-voltage node has a highest voltage value that is greater than a highest voltage value of a low-voltage node.

The sensing amplification circuit 173 may sense and amplify a voltage difference between the bit line BL and the complementary bit line BLB. For this, the sensing amplification circuit 173 may receive voltages separately through at least two nodes. In an example embodiment, a first high-voltage node N1 and a second high-voltage node N2 may receive voltages that are higher than those of a first low-voltage node N3 and a second low-voltage node N4. According to an embodiment of the inventive concept, a sensing amplification circuit may be easily controlled and an effective sensing margin may be increased to provide more accurate sensing by receiving voltages through at least two nodes.

In an example embodiment of the inventive concept, the first high-voltage node N1 and the second high-voltage node N2 may be short-circuited, or the first low-voltage node N3 and the second low-voltage node N4 may be short-circuited. As a result of such a configuration, the first high-voltage node N1 and the second high-voltage node N2 may receive an identical voltage. In addition, the first low-voltage node N3 and the second low-voltage node N4 may receive an identical voltage.

The first power supply voltage switching circuit 174_1 may apply a voltage to at least one of the first high-voltage node N1 and the second high-voltage node N2 in response to receiving the power supply voltage control signal VS. As described subsequently herein below, the first power supply voltage switching circuit 174_1 may control both of the first and second high-voltage nodes N1 and N2 at one time by the power supply voltage control signal VS, and may also apply a voltage to each of the first and second high-voltage nodes N1 and N2 by two control signals (for example, first and second power supply voltage control signals).

The second power supply voltage switching circuit 174_2 may apply a voltage to at least one of the first and second low-voltage nodes N3 and N4 in response to the complementary power supply voltage control signal VSB. As described subsequently herein below, the second power supply voltage switching circuit 174_2 may control both the first and second low-voltage nodes N3 and N4 at one time by the complementary power voltage control signal VSB. In addition, the second power voltage switching circuit 174_2 may also apply a voltage to each of the first and second low-voltage nodes N3 and N4 by two control signals (for example, first and second complementary power voltage control signals). The first and second complementary power voltage control signals may be respectively applied to the first and second low-voltage nodes N3 and N4.

Figure 4:
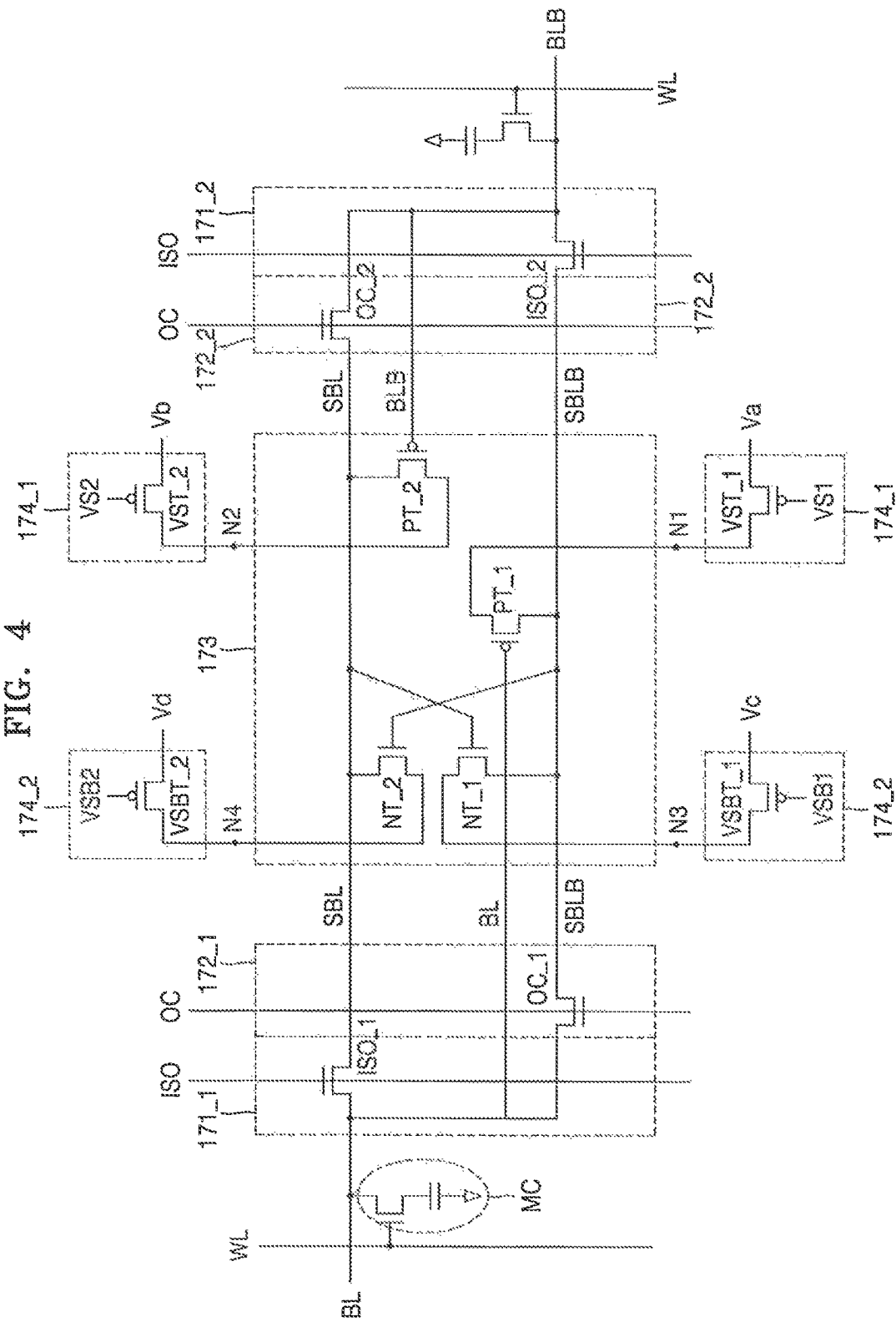
FIG. 4 is a circuit diagram of a bit line sense amplifier according to an example embodiment of the inventive concept.

FIG. 4 is a circuit diagram of the bit line sense amplifier 170 according to an example embodiment of the inventive concept. In FIG. 4, like reference numerals to those in FIG. 3 denote like elements, and therefore, repeated descriptions thereof may not be given herein regarding like elements.

Referring to FIGS. 3 and 4, the bit line sense amplifier 170 according to an example embodiment of the inventive concept may further include the first isolation switching circuit 171_1, the first offset cancellation circuit 172_1, the sensing amplification circuit 173, the second isolation switching circuit 171_2, the second offset cancellation circuit 172_2, the first power supply voltage switching circuit 174_1, and the second power supply voltage switching circuit 174_2.

The first isolation switching circuit 171_1 may include a first isolation switch ISO_1 which may be a transistor. One end of the first isolation switch ISO_1 may be connected to the bit line BL and the other end may be connected to the sensing bit line SBL. The first isolation switch ISO_1 may operate to connect, or to disconnect the bit line BL and the sensing bit line SBL according to the received isolation signal ISO.

The first offset cancellation circuit 172_1 may include a first offset cancellation switch OC_1. One end of the first offset cancellation switch OC_1 may be connected to the bit line BL and the other end may be connected to a complementary sensing bit line SBLB. The first offset cancellation switch OC_1 may connect, or disconnect, the bit line BL and the complementary sensing bit line SBLB according to a level of the received offset cancellation signal OC.

With continued reference to FIGS. 3 and 4, the second isolation switching circuit 171_2 may include a second isolation switch ISO_2. One end of the first isolation switch ISO_2 may be connected to the complementary bit line BLB and the other end may be connected to the complementary sensing bit line SBLB. The second isolation switch ISO_2 may connect, or disconnect, the complementary bit line BLB and the complementary sensing bit line SBLB according to a level of the received isolation signal ISO.

The second offset cancellation circuit 172_2 may include a second offset cancellation switch OC_2. One end of the second offset cancellation switch OC_2 may be connected to the complementary bit line BLB, and the other end may be connected to the sensing bit line SBL. The second offset cancellation switch OC_2 may connect, or disconnect, the complementary bit line BLB and the sensing bit line SBL according to the offset cancellation signal OC.

Although FIG. 4 shows the first isolation switch ISO_1, the second isolation switch ISO_2, the first offset cancellation switch OC_1, and the second offset cancellation switch OC_2 as an n-channel metal-oxide-semiconductor (NMOS) transistor, the inventive concept is not limited thereto. Moreover, a person of ordinary skill in the art should understand and appreciate that any switch device, such as a p-channel metal-oxide-semiconductor (PMOS) transistor, may be used to construct the bit line sense amplifier according to the inventive concept.

The bit line sense amplifier 170 may include first and second PMOS transistors PT_1 and PT_2 and first and second NMOS transistors NT_1 and NT_2. One end of the first PMOS transistor PT_1 may be connected to the complementary sensing bit line SBLB, the other end may be connected to the first high-voltage node N1, and a gate of the first PMOS transistor PT_1 may be connected to the bit line BL. One end of the second PMOS transistor PT_2 may be connected to the sensing bit line SBL, the other end may be connected to the second high-voltage node N2, and a gate of the second PMOS transistor PT_2 may be connected to the complementary bit line BLB.

With continued reference to FIG. 4, one end of the first NMOS transistor NT_1 may be connected to the complementary sensing bit line SBLB, the other end the first NMOS transistor NT_1 may be connected to the first low-voltage node N3, and a gate of the first NMOS transistor NT_1 may be connected to the sensing bit line SBL. One end of the second NMOS transistor NT_2 may be connected to the sensing bit line SBL, the other end the second NMOS transistor NT_2 may be connected to the second low-voltage node N4, and a gate of the second NMOS transistor NT_2 may be connected to the complementary sensing bit line SBLB.

Figure 5A:
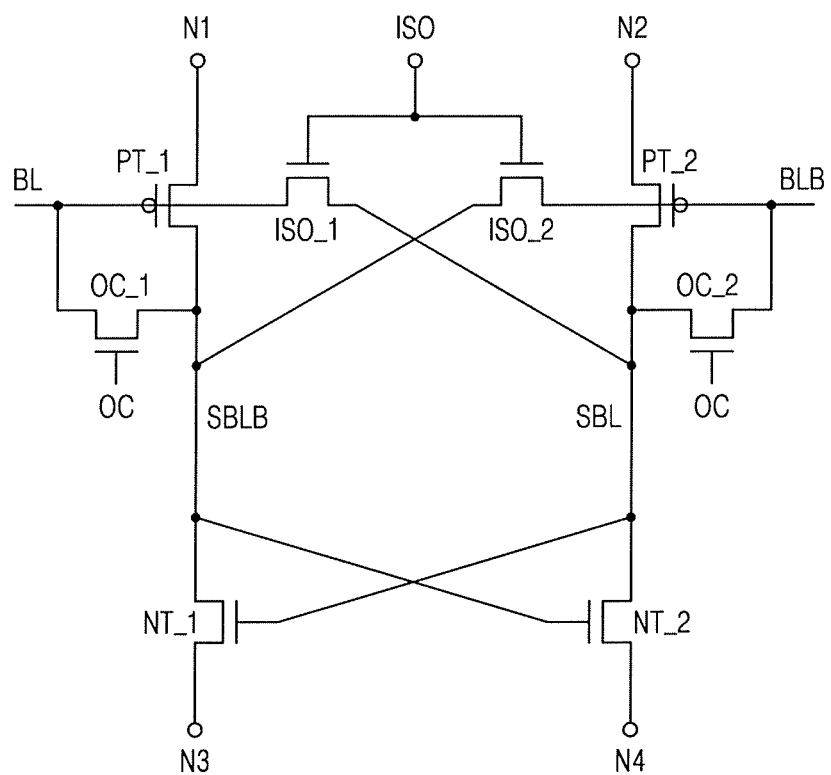
FIGS. 5A and 5B are circuit diagrams of bit line sense amplifiers according to an example embodiment of the inventive concept.
Figure 5B:
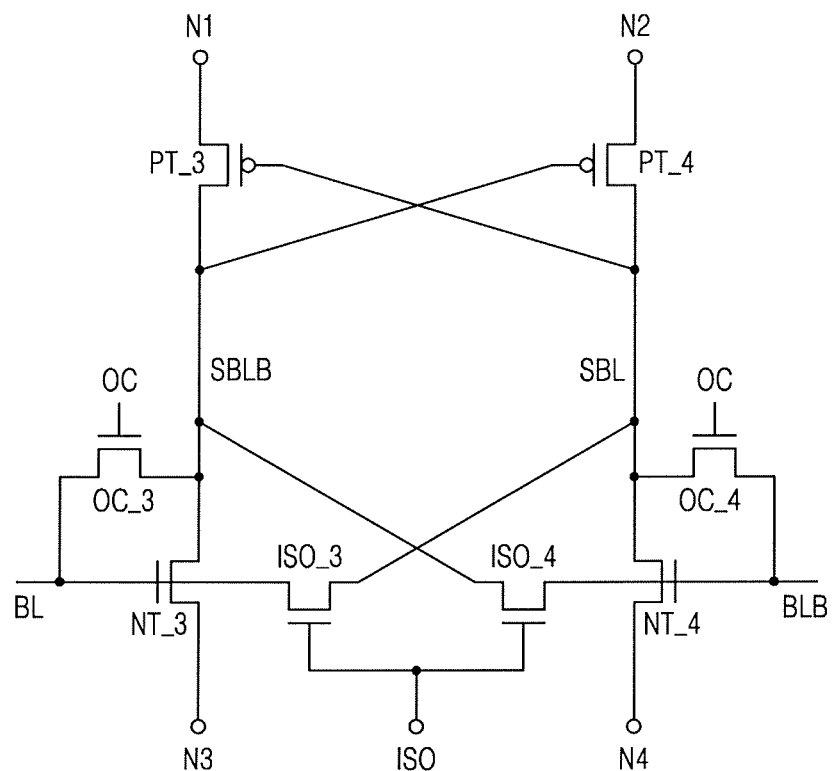

With reference to FIGS. 5A and 5B, in another example embodiment of the inventive concept, positions of the first and second PMOS transistors PT_1 and PT_2, and the first and second NMOS transistors NT_1 and NT_2, may be switched. For example, an NMOS transistor may be replaced with a PMOS transistor, and a PMOS transistor may be replaced with an NMOS transistor. Furthermore, as subsequently described herein below with reference to FIGS. 7A and 7B, in another example embodiment of the inventive concept, the first and second high-voltage nodes N1 and N2 may be short-circuited or the first and second low-voltage nodes N3 and N4 may be short-circuited.

The first power supply voltage switching circuit 174_1 may include a first power supply voltage switch VST_1 and a second power supply voltage switch VST_2 (see FIG. 4). In an example embodiment, the first and second power supply voltage switches VST_1 and VST_2 may be PMOS transistors or NMOS transistors. In this embodiment of the inventive concept, it is assumed that the first and second power supply voltage switches VST_1 and VST_2 are PMOS transistors, but the inventive concept is not limited thereto.

With reference to FIG. 4, one end of the first power voltage switch VST_1 may be connected to the first high-voltage node N1, a first power voltage Va may be applied to the other end, and a first power voltage control signal VS1 may be applied to a gate of the first power voltage switch VST_1. The first power supply voltage switch VST_1 may apply the first power supply voltage Va to the first high-voltage node N1 in response to the first power supply voltage control signal VS1.

FIG. 4 also shows that one end of the second power supply voltage switch VST_2 may be connected to the second high-voltage node N2, a second power supply voltage Vb may be applied to the other end, and a second power supply voltage control signal VS2 may be applied to a gate of the second power supply voltage switch VST_2. The second power supply voltage switch VST_2 may apply the second power supply voltage Vb to the second high-voltage node N2 in response to the second power supply voltage control signal VS2.

In another example embodiment of the inventive concept, the first power supply voltage switch VST_1 and the second power supply voltage switch VST_2 are connected to the first high-voltage node N1 in correspondence with one power supply voltage control signal VS, and may apply the first power supply voltage Va to the first high-voltage node N1 and the second power supply voltage Vb to the second high-voltage node N2, respectively. The first power supply voltage Va and the second power supply voltage Vb may be an identical voltage (for example, an input voltage or a precharge voltage).

FIG. 4 also shows that the second power supply voltage switching circuit 174_2 may include a first complementary power supply voltage switch VSBT_1 and a second complementary power supply voltage switch VSBT_2. In an example embodiment, the first complementary power supply voltage switch VSBT_1 and the second complementary power supply voltage switch VSBT_2 may be PMOS transistors or NMOS transistors. In this example, it is assumed that the first complementary power supply voltage switch VSBT_1 and the second complementary power supply voltage switch VSBT_2 are PMOS transistors, but the inventive concept is not limited thereto.

As shown in FIG. 4, one end of the first complementary power supply voltage switch VSBT_1 may be connected to the first low-voltage node N3, a third power supply voltage Vc may be applied to the other end, and a first complementary power supply voltage control signal VSB1 may be applied to a gate of the first complementary power supply voltage switch VSBT_1. The first complementary power supply voltage switch VSBT_1 may apply the third power supply voltage Vc to the first low-voltage node N3 corresponding to the first complementary power supply voltage control signal VSB1.

FIG. 4 also shows that one end of the second complementary power supply voltage switch VSBT_2 may be connected to the second low-voltage node N4, a fourth power supply voltage Vd may be applied to the other end, and a second complementary power supply voltage control signal VSB2 may be applied to a gate of the second complementary power supply voltage switch VSBT_2. The second complementary supply voltage switch VSBT_2 may apply the fourth supply voltage Vd to the second low-voltage node N4 corresponding to the second complementary supply voltage control signal VSB2.

In another example embodiment of the inventive concept, the first complementary power supply voltage switch VSBT_1 and the second complementary power supply voltage switch VSBT_2 are controlled by one complementary power supply voltage control signal VSB, and may apply the third power supply voltage Vc to the first low-voltage node N3 and the fourth power supply voltage Vd to the second low-voltage node N4, respectively. The third power supply voltage Vc and the fourth power supply voltage Vd may be an identical voltage (for example, a ground voltage or a precharge voltage).

FIGS. 5A and 5B are circuit diagrams of examples of bit line sense amplifiers 170a and 170b according to an example embodiment of the inventive concept. In FIGS. 5A and 5B, like reference numerals to those in FIGS. 3 and 4 denote like elements, and therefore, repeated descriptions thereof will not be given herein.

Referring to FIG. 4, and FIGS. 5A and 5B, FIG. 5A is an equivalent circuit diagram of the bit line sense amplifier 170a excluding the first and second power supply voltage switching circuits 174_1 and 174_2 from the bit line sense amplifier 170, and FIG. 5B provides a circuit diagram in which positions of the first and second PMOS transistors PT_1 and positions of PT_2 and the first and second NMOS transistors NT_1 and NT_2 in FIG. 5A are switched. The bit line sense amplifier 170b of FIG. 5B may be the same or similar to the bit line sense amplifier 170a of FIG. 5A, although positions of transistors constituting the sensing amplification circuit 173 are different from those in the bit line sense amplifier 170a shown in FIG. 5A.

Although the bit line sense amplifier 170a of FIG. 5A is described herein, a person of ordinary skill in the art should understand and appreciate that the inventive concept may also be applied to the bit line sense amplifier 170b of FIG. 5B.

Figure 6A:
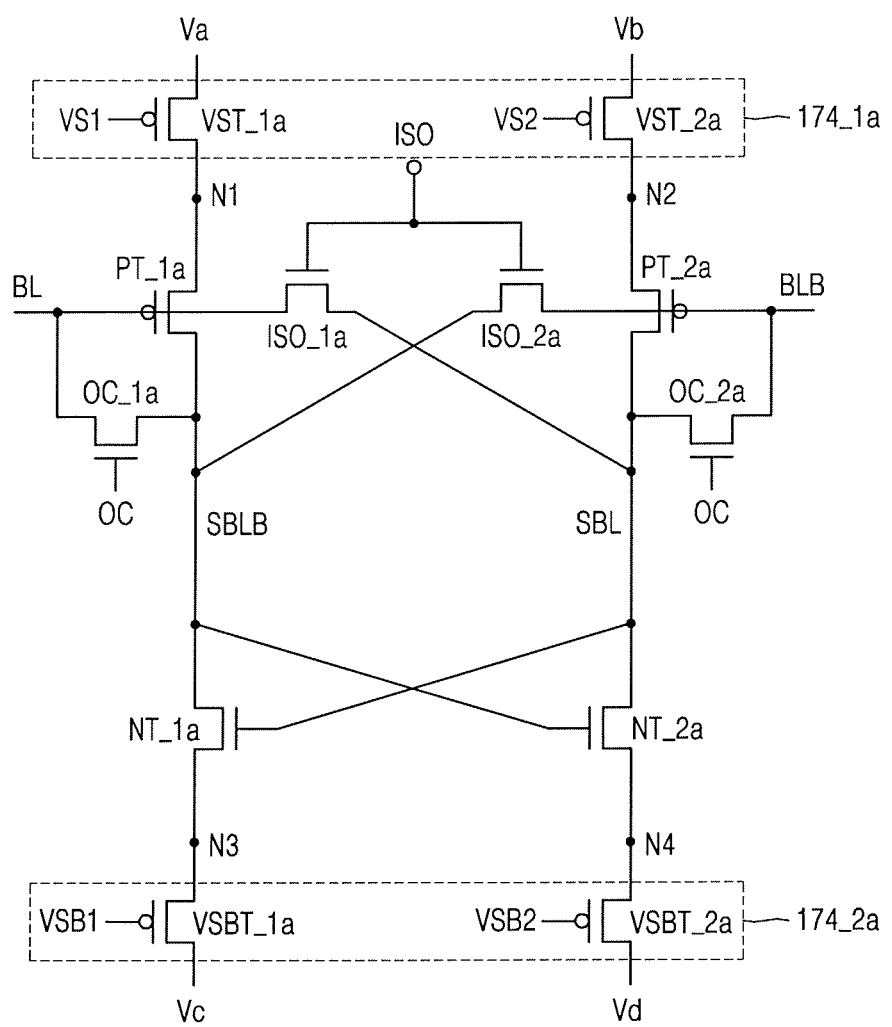
FIGS. 6A and 6B are circuit diagrams of bit line sense amplifiers according to an example embodiment of the inventive concept.
Figure 6B:
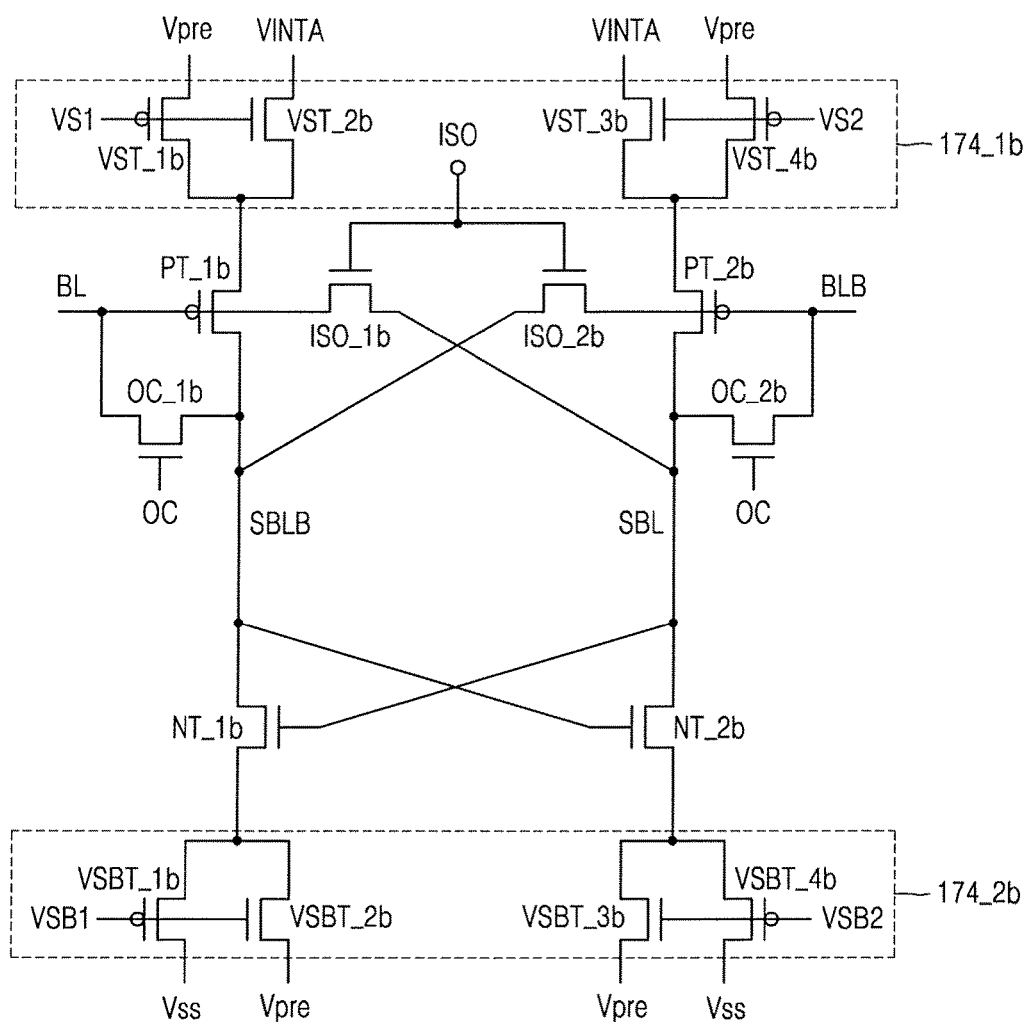

FIGS. 6A and 6B are circuit diagrams of examples of bit line sense amplifiers according to an example embodiment of the inventive concept. In FIGS. 6A and 6B, like reference numerals to those in FIGS. 3 and 4 denote like elements, and therefore, repeated descriptions thereof will not be given herein.

FIG. 6A shows that each of a first power supply voltage switch VST_1a included in a first power supply voltage switching circuit 174_1a and a second power supply voltage switching circuit 174_2a, a second power supply voltage switch VST_2a, a first complementary power supply voltage switch VSBT_1a, and a second complementary power supply voltage switch VSBT_2a is configured as one transistor. However, the aforementioned configuration shown is only an example embodiment, and devices with a switch function (for example, a plurality of transistors connected in parallel with each other) may constitute the first power supply voltage switch VST_1a, the second power supply voltage switch VST_2a, the first complementary power supply voltage switch VSBT_1a, and the second complementary power supply voltage switch VSBT_2a.

FIG. 6B is a circuit diagram of a bit line sense amplifier in which the first and second power supply voltage switching circuit 174_1 and the second power supply voltage switching circuit 174_2 are different from those shown in FIG. 4. Referring to FIG. 6B, a first power supply voltage switching circuit 174_1b may include a first power supply voltage switch VST_1b, a second power supply voltage switch VST_2b, a third power supply voltage switch VST_3b, and a fourth power supply voltage switch VST_4b. The first and second power supply voltage switches VST_1b and VST_4b may operate in a complementary manner with the second and third power supply voltage switches VST_2b and VST_3b, respectively. For example, when the first and fourth power supply voltage switches VST_1b and VST_4b are comprised of at least one parallel-connected PMOS transistor, the second and third power supply voltage switches VST_2b and VST_3b may be comprised of at least one parallel-connected NMOS transistor.

In response to the first power supply voltage control signal VS1, the first and second power supply voltage switches VST_1b and VST_2b may operate in a complementary manner with each other. For example, when the first power supply voltage control signal VS1 is logic high, the first power supply voltage switch VST_1b may be in an OFF state and the second power supply voltage switch VST_2b may be in an ON state. Accordingly, an input voltage VINTA may be applied to the first high-voltage node N1. In addition, when the first power supply voltage control signal VS1 is logic low, the first power supply voltage switch VST_1b may be in an ON state and the second power supply voltage switch VST_2b may be in an OFF state. Accordingly, the precharge voltage Vpre may be applied to the first high-voltage node N1.

In response to receiving the second power supply voltage control signal VS2, the third and fourth power supply voltage switches VST_3b and VST_4b may operate in a complementary manner with each other. For example, when the second power supply voltage control signal VS2 is logic high, the fourth power supply voltage switch VST_4b may be in an OFF state and the third power supply voltage switch VST_3b may be in an ON state. Accordingly, the input voltage VINTA may be applied to the second high-voltage node N2. For example, when the second power supply voltage control signal VS2 is logic low, the fourth power supply voltage switch VST_4b may be in an ON state and the third power supply voltage switch VST_3b may be in an OFF state. Accordingly, the precharge voltage Vpre may be applied to the second high-voltage node N2.

A second power supply voltage switching circuit 174_2b may include a first complementary power supply voltage switch VSBT_1b, a second complementary power supply voltage switch VSBT_2b, a third complementary power supply voltage switch VSBT_3b, and a fourth complementary power supply voltage switch VSBT_4b. The first and fourth complementary power supply voltage switches VSBT_1b and VSBT_4b may operate in a complementary manner with the second and third complementary power supply voltage switches VSBT_2b and VSBT_3b, respectively. For example, when the first and fourth complementary power supply voltage switches VSBT_1b and VSBT_4b are at least one parallel-connected PMOS transistor, the second and third complementary power supply voltage switches VSBT_2b and VSBT_3b may be at least one parallel-connected NMOS transistor.

In response to the first complementary power supply voltage control signal VSB1, the first and second complementary power supply voltage switches VSBT_1b and VSBT_2b may operate in a complementary manner with each other. For example, when the first complementary power supply voltage control signal VSB1 is logic high, the first complementary power supply voltage switch VSBT_1b may be in an OFF state and the second complementary power supply voltage switch VSBT_2b may be in an ON state. Accordingly, the precharge voltage Vpre may be applied to the first low-voltage node N3. In addition, when the first complementary power supply voltage control signal VSB1 is logic low, the first complementary power supply voltage switch VSBT_1b may be in an ON state and the second complementary power supply voltage switch VSBT_2b may be in an OFF state. Accordingly, a ground voltage $V_{SS}$ may be applied to the first low-voltage node N3.

In response to the second complementary power supply voltage control signal VSB2, the third and fourth complementary power supply voltage switches VSBT_3b and VSBT_4b may operate in a complementary manner with each other. For example, when the second complementary power supply voltage control signal VSB2 is logic high, the fourth complementary power supply voltage switch VSBT_4b may be in an OFF state and the third complementary power supply voltage switch VSBT_3b may be in an ON state. Accordingly, the precharge voltage Vpre may be applied to the second low-voltage node N4. In addition, when the second complementary power supply voltage control signal VSB2 is logic low, the fourth complementary power supply voltage switch VSBT_4b may be in an ON state and the third complementary power supply voltage switch VSBT_3b may be in an OFF state. Accordingly, the ground voltage $V_{SS}$ may be applied to the second low-voltage node N4.

In an example embodiment, the first complementary power supply voltage control signal VSB1 may be the same or similar as the second complementary power supply voltage control signal VSB2 and the first complementary power supply voltage control signal VSB1 may be the same or similar as the second complementary power supply voltage control signal VSB2. Furthermore, in an example embodiment, the first complementary power supply voltage control signal VSB1 may be complementary to the first power supply voltage control signal VS1, and the second complementary power supply voltage control signal VSB2 may be complementary to the second power supply voltage control signal VSB1.

Figure 7A:
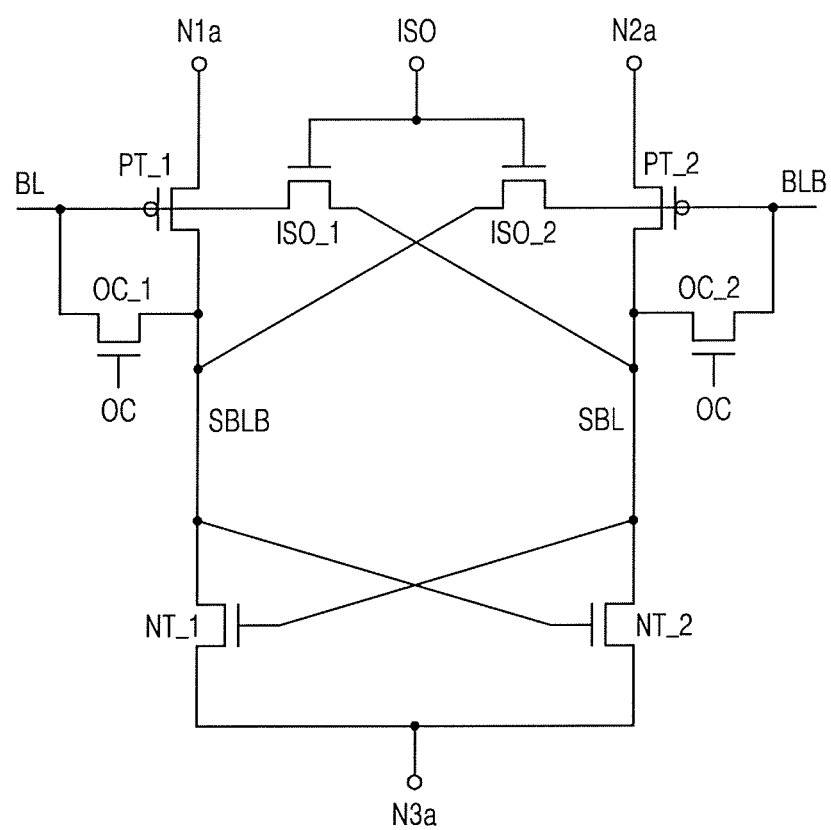
FIGS. 7A, 7B and 7C are circuit diagrams of different configurations of bit line sense amplifiers according to an example embodiment of the inventive concept.
Figure 7B:
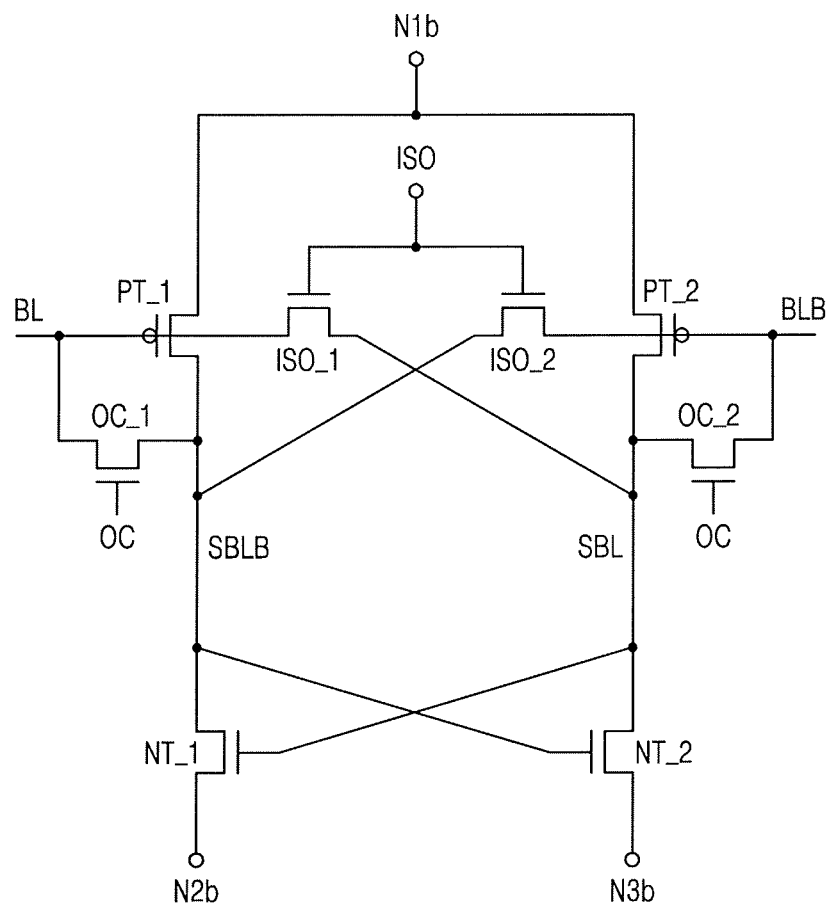
Figure 7C:
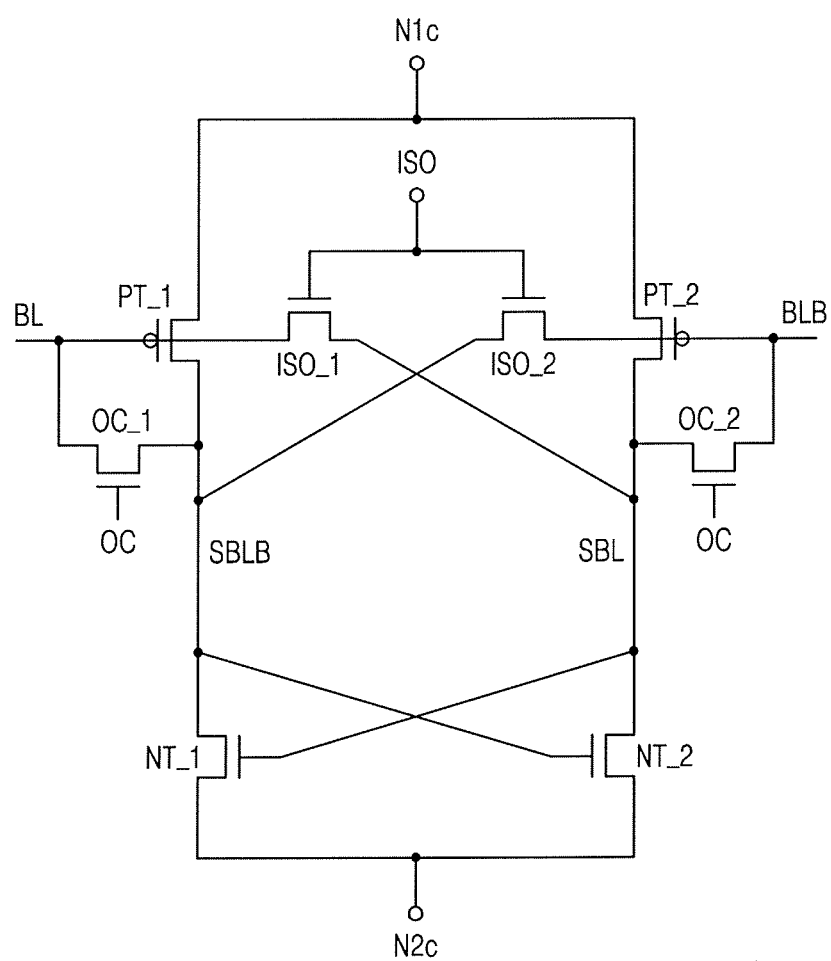

FIGS. 7A, 7B and 7C are circuit diagrams of bit line sense amplifiers according to an example embodiment of the inventive concept. In FIGS. 7A to 7C, like reference numerals to those in FIGS. 4 and 5A denote like elements, and therefore, repeated descriptions thereof will not be given herein.

FIGS. 7A to 7C are circuit diagrams in which at least two nodes among the four nodes N1 to N4 of FIG. 5A are connected to each other as compared with the bit line sense amplifier 170a of FIG. 5A. Referring to FIGS. 5A and 7A, the first and second low-voltage nodes N3 and N4 of FIG. 5A may be connected to each other like a first low-voltage node N3a of FIG. 7A. When the first low-voltage node N3a is configured as shown in FIG. 7A, voltages may be simultaneously applied to the first and second low-voltage nodes N3 and N4 of FIG. 5A.

Referring to FIGS. 5A and 7B, the first and second high-voltage nodes N1 and N2 of FIG. 5A may be connected to each other like a first high-voltage node N1b of FIG. 7B. When a first high-voltage node N1a is configured as shown in FIG. 7B, voltages may be simultaneously applied to the first and second high-voltage nodes N1 and N2 of FIG. 5A.

Referring to FIGS. 5A and 7C, the first and second high-voltage nodes N1 and N2 of FIG. 5A may be connected to each other like a first high-voltage node N1c of FIG. 7C, and the first and second low-voltage nodes N3 and N4 of FIG. 5A may be connected to each other like a first low-voltage node N2c of FIG. 7C. When the first high-voltage node N1c and the first low-voltage node N2c are configured as shown in FIG. 7A, voltages may be simultaneously applied to the first and second high-voltage nodes N1 and N2 and the first and second low-voltage nodes N3 and N4 of FIG. 5A. Although not shown, the power supply voltage switching circuits 174_1a, 174_2a, 174_1b, and 174_2b described in FIGS. 6A and 6B may be connected to the nodes of FIGS. 7A to 7C, respectively.

Figure 8:
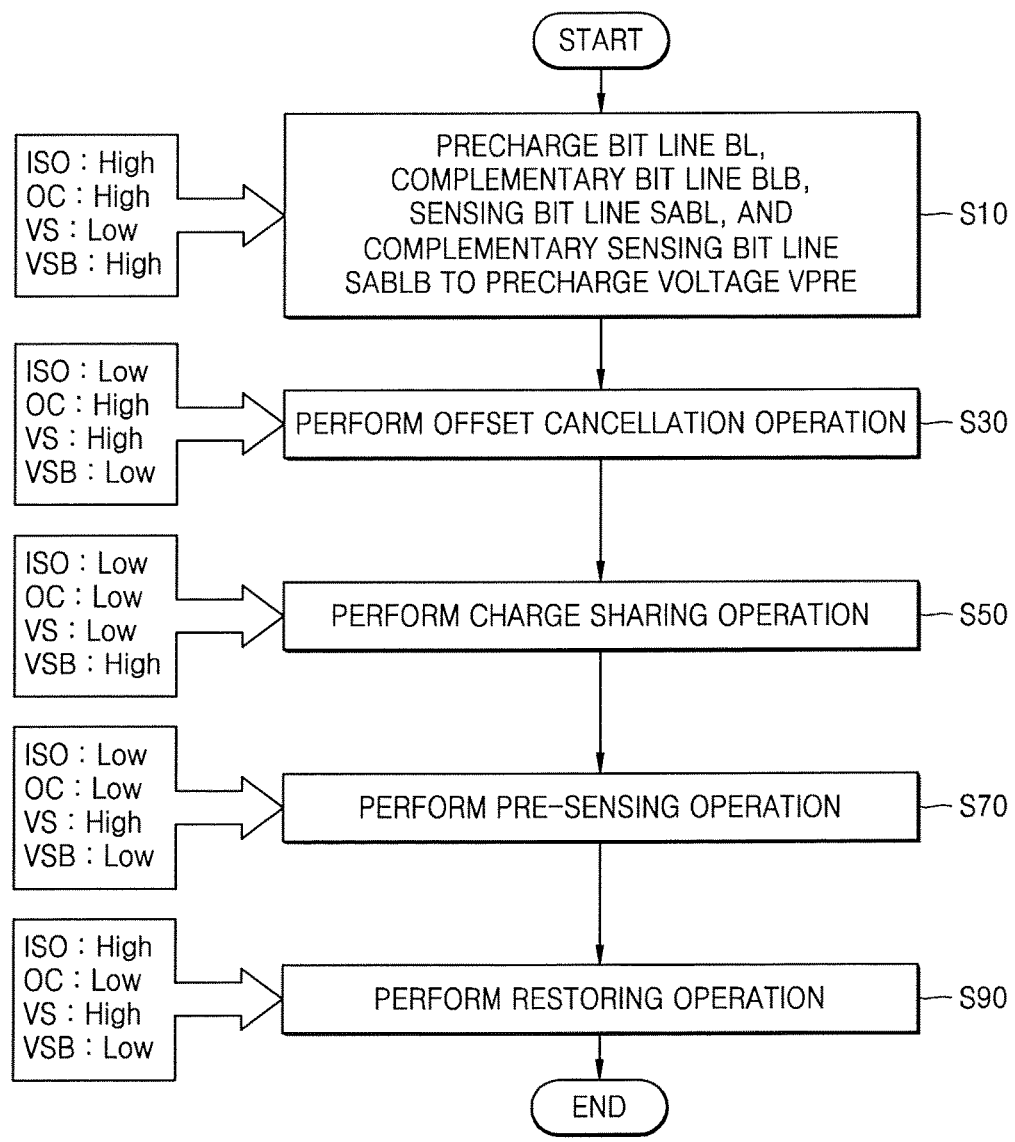
FIG. 8 is a flowchart illustrating an operational example of a bit line sense amplifier according to an example embodiment of the inventive concept.

FIG. 8 is a flowchart illustrating an operational example of a bit line sense amplifier according to an example embodiment of the inventive concept. FIG. 8 operations are based on the circuit diagram of FIG. 6B. For the sake of convenience, the states of the ISO, OC, VS and VSB are provided at each operation in the boxes along the left-hand side of FIG. 8.

Referring to FIGS. 6B and 8, in operation S10, as the isolation signal ISO transitions to logic high, the offset cancellation signal OC transitions to logic high, the first and second power supply voltage control signals VS1 and VS2 transition to logic low, and the first and second complementary power supply voltage control signals VSB1 and VSB2 transition to logic high, the bit line BL, the complementary bit line BLB, a sensing bit line SABL, and the complementary sensing bit line SABLB may be precharged to the precharge voltage Vpre.

Next, in operation S30, as the isolation signal ISO transitions to logic low, the first and second power supply voltage control signals VS1 and VS2 transitions to logic high, the first and second complementary power supply voltage control signals VSB1 and VSB2 transitions to logic low, and the offset cancellation signal OC remains at logic high, an offset cancellation operation may be performed. In operation S50, a charge sharing operation is performed as the offset cancellation signal OC transitions to logic low, the first and second power supply voltage control signals VS1 and VS2 transitions to logic low, the first and second complementary power supply voltage control signals VSB1 and VSB2 transition to logic high, and the isolation signal ISO remains at logic low. In operation S70, a pre-sensing operation may be performed as the first and second power supply voltage control signals VS1 and VS2 transitions to logic high and the first and second complementary power supply voltage control signals VSB1 and VSB2 transition to logic low. In operation S90, a restoring operation may be performed as the isolation signal ISO transitions to logic high and the offset cancellation signal OC transitions to logic low after the pre-sensing operation. Bit line sensing may be performed through the above operations.

Figure 9:
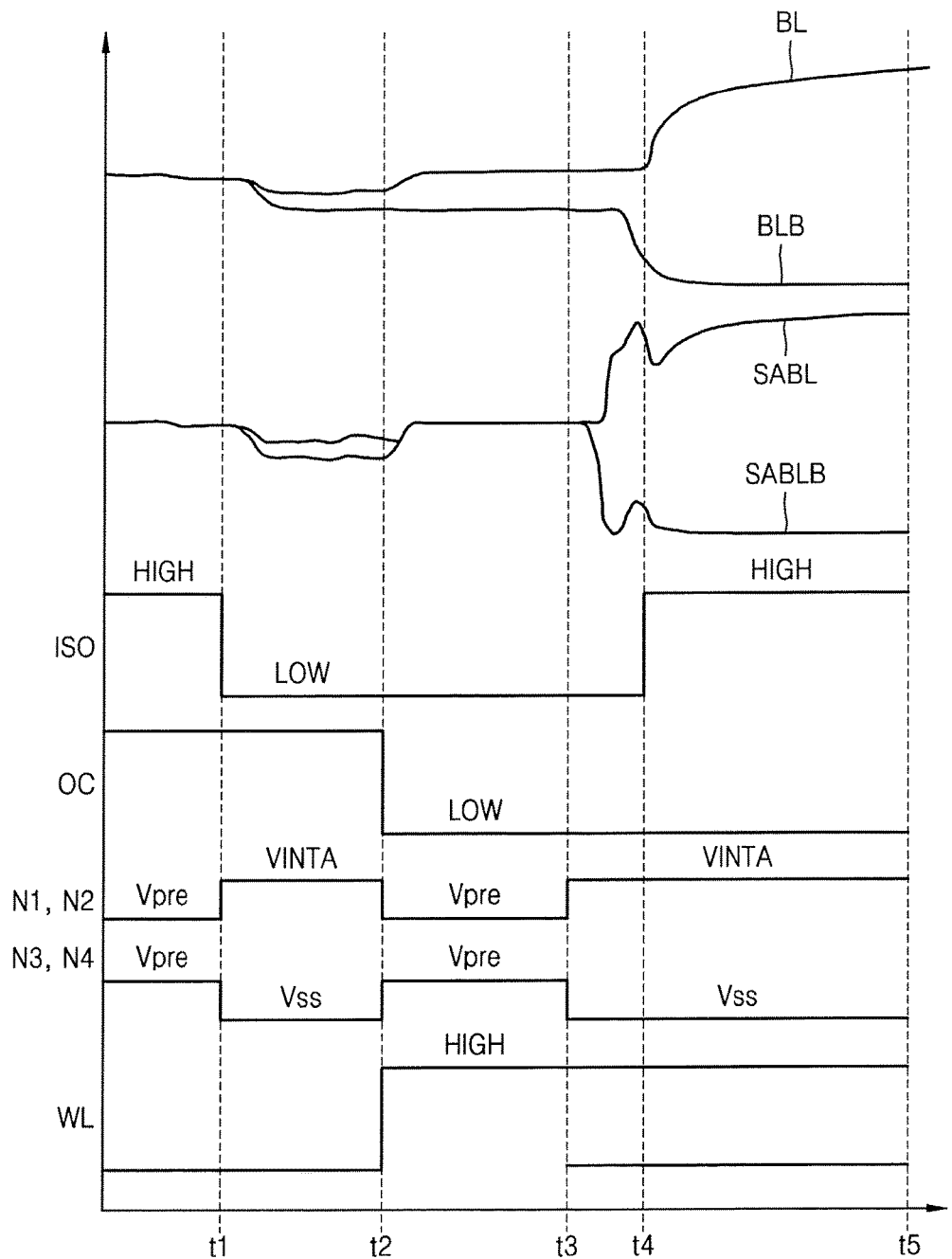
FIG. 9 is a timing diagram illustrating an operation of a bit line sense amplifier according to an example embodiment of the inventive concept.

FIG. 9 is a timing diagram for explaining an operation of the bit line sense amplifier 170 according to an example embodiment of the inventive concept. In FIG. 9, like reference numerals to those in FIGS. 4 and 8 denote like elements, and therefore, repeated descriptions thereof will not be given herein.

Referring to FIGS. 4, 8, and 9, the bit line sense amplifier 170 may sequentially perform an precharge operation, an offset cancellation operation, a charge sharing operation, a pre-sensing operation, and a restoring operation. First, the bit line sense amplifier 170 may perform the precharge operation during a first section of time t0 to t1 shown along the x-axis of FIG. 9. Here, the isolation signal ISO and the offset cancellation signal OC are logic high, and a bit line pair BL and BLB and a sensing bit line pair SABL and SABLB may be charged with the precharge voltage Vpre.

Thereafter, the bit line sense amplifier 170 may perform an offset cancellation operation during a second section of time t1 to t2 identified by the timing diagram of FIG. 9. The isolation signal ISO may be logic low. Voltages of the first and second high-voltage nodes N1 and N2 increase from the precharge voltage Vpre to the input voltage VINTA and voltages of the third and second low-voltage nodes N3 and N4 decrease from the precharge voltage Vpre to the ground voltage $V_{SS}$. The bit line sense amplifier 170 may perform the offset cancellation operation. During the offset cancellation operation, the bit line BL may be higher than the complementary bit line BLB by an offset voltage. For example, voltages of the bit line pair BL and BLB may decrease by threshold voltages of transistors of the sensing amplification circuit 173, respectively.

The bit line sense amplifier 170 may perform the charge sharing operation during a third section of time t2 to t3 identified by the timing diagram of FIG. 9. The isolation signal ISO and the offset cancellation signal OC transitions to logic low and the word line WL is activated to cause charge sharing between charges of the bit line BL and charges stored in the memory cell MC. For example, when "data 1" is stored in the memory cell MC (voltages of capacitors of the memory cell MC are equal to or greater than a reference value), a bit line voltage VBL may increase by a voltage variation amount ΔV. Although not shown in the drawings, when "data 0" is stored in the memory cell MC, a bit line voltage VBL may decrease by a voltage variation amount ΔV.

The bit line sense amplifier 170 may perform the pre-sensing operation in a fourth section of time t3 to t4 shown in the timing diagram of FIG. 9. Voltages of the first and second high-voltage nodes N1 and N2 may transition to the input voltage VINTA and a second input signal LAB may transition to the ground voltage $V_{SS}$. Accordingly, the sensing bit line SABL may be amplified to the input voltage VINTA, and the complementary sensing bit line SABLB may decrease to the ground voltage $V_{SS}$.

The bit line sense amplifier 170 may perform the restoring operation in a fifth section of time t4 to t5 shown in the timing diagram of FIG. 9. Here, the isolation signal ISO transitions to logic high so that the first and second isolation switches ISO_1 and ISO_2 may be turned on. For example, the bit line pair BL and BLB and the sensing bit line pair SABL and SABLB are connected to each other, and each of the bit line pair BL and BLB may be charged or discharged to a level of the sensing bit line pair SABL and SABLB.

Figure 10:
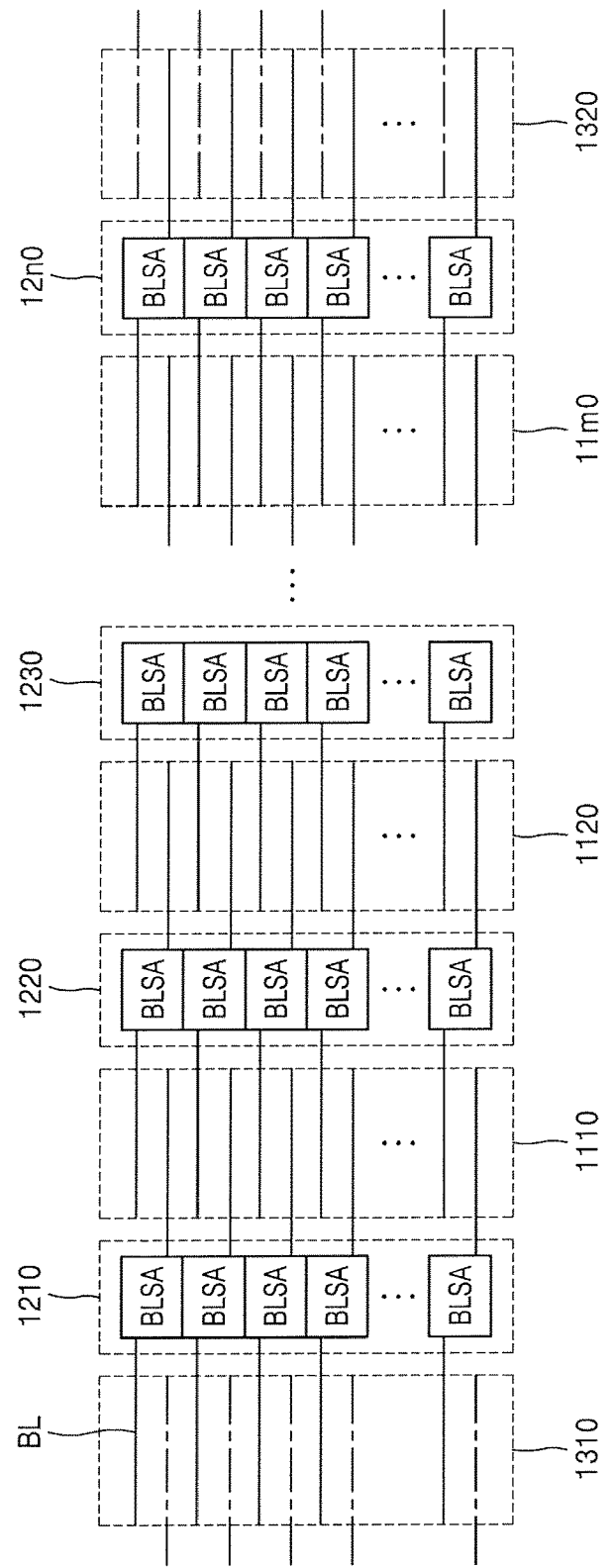
FIG. 10 is an example of one view of a memory device to which a bit line sense amplifier of the inventive concept is applied.

FIG. 10 is an exemplary view of a memory device 1000 to which a bit line sense amplifier of the inventive concept is applied.

Referring to FIG. 10, the memory device 1000 may include a plurality of memory cell arrays 1110 to 11m0, a plurality of bit line sense amplifier sub-circuits 1210 to 12n0, and dummy arrays 1310 and 1320. A plurality of bit line pairs BL and BLB connected to the plurality of memory cell arrays 1110 to 11m0 may be connected to a plurality of bit line sense amplifiers BLSA, respectively. The plurality of bit line sense amplifiers BLSA may be the bit line sense amplifiers described with reference to FIGS. 1 to 9.

The memory device 1000 including the plurality of bit line sense amplifiers BLSA performs an offset cancellation operation and a pre-sensing operation, so that bit line coupling noise (BL coupling noise) and bit line sense amplifier offset noise (S/A offset noise) may be reduced. Accordingly, a voltage variation amount exceeding a certain level may be secured. In addition, according to an embodiment of the inventive concept, a power supply voltage of a sensing bit line and a complementary sensing bit line are separately applied to perform bit line sensing more efficiently, and a sensing error may be prevented.

Figure 11:
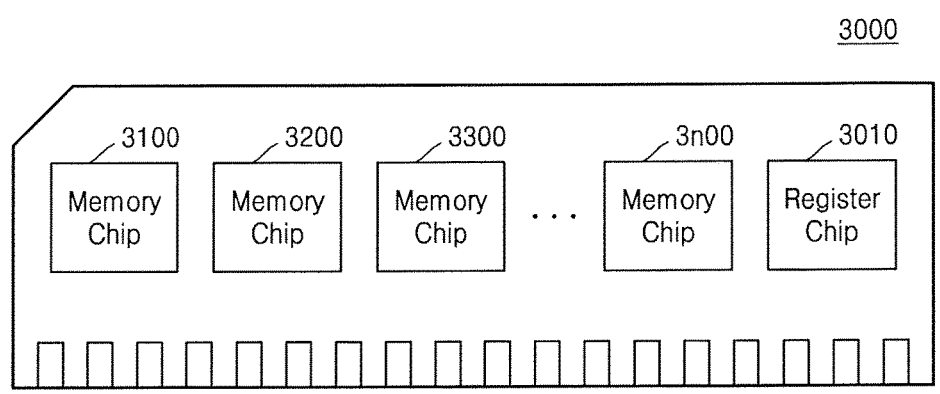
FIG. 11 is an example of a view of a memory module to which a memory device of the inventive concept is applied.

FIG. 11 is a view of a memory module 3000 to which a memory device of the inventive concept is applied.

Referring to FIG. 11, the memory module 3000 may include a plurality of memory chips 3100 to 3n00 and a register chip 3010. The plurality of memory chips 3100 through 3n00 may include the memory device 100 of FIG. 1.

The plurality of memory chips 3100 to 3n00 may receive commands, addresses, data, and the like from an external device (e.g., a host, a memory controller, an access point (AP), etc.) and perform a data read/write operation. The register chip 3010 may receive a command, a control signal, and the like from an external device, and may store mode register set (MRS) information based on the received command, control signal, and the like.

The plurality of memory chips 3100 to 3n00 may each include the bit line sense amplifiers described with reference to FIGS. 2 to 9, respectively. For example, each of the plurality of memory chips 3100 to 3n00 may be the memory device 1000 of FIG. 10. Accordingly, the plurality of memory chips 3100 to 3n00 may perform offset cancellation operations and pre-sensing operations, so that BL coupling noise and bit line sense amplifier offset noise (S/A offset noise) may be reduced. Accordingly, a voltage variation amount exceeding a certain level may be secured. In addition, a power supply voltage of a sensing bit line and a complementary sensing bit line are separately applied to perform bit line sensing more efficiently, and a sensing error may be prevented.

While the inventive concept has been particularly shown and described with reference to example embodiments thereof, a person of ordinary skill in the art will understand that various changes in form and details may be made therein without departing from the spirit and scope of the following claims.

What is claimed is:

1. A bit line sense amplifier comprising:
   a sensing amplification circuit respectively connected to a bit line and to a complementary bit line, and the sensing amplification circuit is configured to sense a voltage change of the bit line and adjust voltages of a sensing bit line and a complementary sensing bit line based on the sensed voltage change of the bit line;
   an isolation switching circuit including a first isolation switch connected to the bit line and the sensing bit line and controlled by an isolation switch control signal, and a second isolation switch connected between the complementary bit line and the complementary sensing bit line and controlled by the isolation switch control signal;
   an offset cancellation circuit including a first offset cancellation switch connected between the bit line and the complementary sensing bit line and controlled by an offset cancellation control signal, and a second offset cancellation switch connected between the complementary bit line and the sensing bit line and controlled by the offset cancellation control signal,
   wherein the sensing amplification circuit comprises:
   a first transistor connected between the complementary sensing bit line and a first high-voltage node, and the first transistor is controlled based on the voltage change of the bit line; and
   a second transistor connected between the sensing bit line and a second high-voltage node, and the second transistor is controlled based on a voltage change of the complementary bit line, wherein the first high voltage node is different from the second high voltage node.

2. The bit line sense amplifier of claim 1, further comprising:
   a power supply voltage switching circuit including a first power supply voltage switch configured to switch a first power supply voltage applied to the first high-voltage node and a second power supply voltage switch configured to switch a second power supply voltage applied to the second high-voltage node.

3. The bit line sense amplifier of claim 2, wherein each of the first and second power supply voltage switches is configured to selectively switch between two or more different voltages.

4. The bit line sense amplifier of claim 3, wherein each of the first and second power supply voltage switches is configured to selectively switch between a ground voltage and an input voltage.

5. The bit line sense amplifier of claim 2, wherein the first power supply voltage applied to the first high-voltage node and the second power supply voltage applied to the second high-voltage node are substantially the same.

6. The bit line sense amplifier of claim 2, wherein the sensing amplification circuit further comprises:
   a third transistor connected between the complementary sensing bit line and a first low-voltage node and controlled by a voltage change of the sensing bit line; and
   a fourth transistor connected between the sensing bit line and the first low-voltage node and controlled by a voltage change of the complementary sensing bit line, wherein
   the power supply voltage switching circuit further comprises a third power supply voltage switch configured to switch a third power supply voltage applied to the first low-voltage node.

7. The bit line sense amplifier of claim 1, wherein the sensing amplification circuit further comprises:
   a third transistor connected between the complementary sensing bit line and a first low-voltage node and controlled by a voltage change of the sensing bit line; and
   a fourth transistor connected between the sensing bit line and a second low-voltage node and controlled by a voltage change of the complementary sensing bit line.

8. The bit line sense amplifier of claim 7, further comprising:
   a power supply voltage switching circuit including a first power supply voltage switch configured to switch a first power supply voltage applied to the first high-voltage node, a second power supply voltage switch configured to switch a second power supply voltage applied to the second high-voltage node, a third power supply voltage switch configured to switch a third power supply voltage applied to the first low-voltage node, and a fourth power supply voltage switch configured to switch a fourth power supply voltage applied to the second low-voltage node.

9. The bit line sense amplifier of claim 8, wherein each of the first and second power supply voltage switches is configured to selectively switch between a ground voltage and an input voltage, and each of the third and fourth power supply voltage switches is configured to selectively switch between the ground voltage and a precharge voltage.

10. The bit line sense amplifier of claim 7, wherein the first and second transistors comprise p-channel metal-oxide-semiconductor (PMOS) transistors, and the third and fourth transistors comprise n-channel metal-oxide-semiconductor (NMOS) transistors.

11. The bit line sense amplifier of claim 7, wherein the first and second transistors comprise n-channel metal-oxide-semiconductor (NMOS) transistors, and the third and fourth transistors comprise p-channel metal-oxide-semiconductor (PMOS) transistors.

12. A bit line sense amplifier comprising:
   a sensing amplification circuit respectively connected to a bit line and to a complementary bit line, and the sensing amplification circuit is configured to sense a voltage change of the bit line and adjust voltages of a sensing bit line and a complementary sensing bit line based on the sensed voltage change;

an isolation switching circuit including a first isolation switch connected to the bit line and the complementary bit line and controlled by an isolation signal, and a second isolation switch connected between the complementary bit line and the complementary sensing bit line and controlled by the isolation signal; and an offset cancellation circuit including a first offset cancellation switch connected between the bit line and the complementary sensing bit line and controlled by an offset cancellation control signal, and a second offset cancellation switch connected between the complementary bit line and the sensing bit line and controlled by the offset cancellation control signal, wherein the sensing amplification circuit comprises:

a first transistor connected between the complementary sensing bit line and a first high-voltage node and controlled by a voltage change of the bit line;

a second transistor connected between the sensing bit line and a second high-voltage node and controlled by a voltage change of the complementary bit line;

a third transistor connected between the complementary sensing bit line and a first low-voltage node and controlled by a voltage change of the sensing bit line; and a fourth transistor connected between the sensing bit line and a second low-voltage node and controlled by a voltage change of the complementary sensing bit line, wherein the first high-voltage node is different from the second high-voltage node, and the first low-voltage node is different from the second low-voltage node.

13. The bit line sense amplifier of claim 12, further comprising:

a power supply voltage switching circuit including a first power supply voltage switch configured to switch a first power supply voltage applied to the first high-voltage node, a second power supply voltage switch configured to switch a second power supply voltage applied to the first low-voltage node, and a third power supply voltage switch configured to switch a third power supply voltage applied to the second low-voltage node.

14. The bit line sense amplifier of claim 13, wherein the first power supply voltage switch is configured to selectively switch between a ground voltage and an input voltage, and each of the second and third power supply voltage switches is configured to selectively switch between the ground voltage and a precharge voltage.

15. The bit line sense amplifier of claim 12, wherein the first and second transistors comprise p-channel metal-oxide-semiconductor (PMOS) transistors, and the third and fourth transistors comprise n-channel metal-oxide-semiconductor (NMOS) transistors.

16. The bit line sense amplifier of claim 12, wherein the first and second transistors comprise n-channel metal-oxide-semiconductor (NMOS) transistors, and the third and fourth transistors comprise p-channel metal-oxide-semiconductor (PMOS) transistors.

17. A memory device comprising:

a plurality of memory cell arrays;

a plurality of bit line sense amplifier sub-circuits alternately arranged with the plurality of memory cell arrays, each one of the plurality of bit line sense amplifier sub-circuits comprising a plurality of bit line sense amplifiers configured to sense a voltage change of a respective bit line and control voltages of a sensing bit line and a complementary sensing bit line; and a plurality of bit line pairs comprising a complementary bit line corresponding to a respective bit line, wherein the plurality of bit line pairs are connected to the plurality of memory cell arrays, respectively, and connected to the plurality of bit line sense amplifiers; and wherein each of the plurality of bit line sense amplifiers is configured to perform an offset cancellation operation and a pre-sensing operation for at least one of the plurality of bit line pairs, and wherein during the offset cancellation operation, the bit line has a higher voltage than the complementary bit line by an offset voltage.

18. The memory device of claim 17, wherein a power supply voltage is separately applied to the sensing bit line and the complementary sensing bit line.

19. The memory device of claim 17, wherein each of plurality of the bit line sense amplifiers is configured to sense a voltage change of the bit line in at least one of the plurality of bit line pairs, and to adjust voltages of the sensing bit line and the complementary sensing bit line arranged to sense based on the sensed voltage change; and an isolation switching circuit including a first isolation switch connected to the bit line and the sensing bit line and controlled by an isolation control signal.

* * * * *